United States Patent
Freyman et al.

(10) Patent No.: US 7,205,811 B2
(45) Date of Patent: Apr. 17, 2007

(54) METHODS AND APPARATUS FOR MAINTAINING DESIRED SLOPE OF CLOCK EDGES IN A PHASE INTERPOLATOR USING AN ADJUSTABLE BIAS

(75) Inventors: Ronald L. Freyman, Bethlehem, PA (US); Craig B. Ziemer, Fleetwood, PA (US)

(73) Assignee: Agere Systems Inc., Allentown, PA (US)

(*) Notice: Subject to any disclaimer, the term of this patent is extended or adjusted under 35 U.S.C. 154(b) by 62 days.

(21) Appl. No.: 11/095,772

(22) Filed: Mar. 31, 2005

(65) Prior Publication Data
US 2006/0220720 A1    Oct. 5, 2006

(51) Int. Cl.
*H03K 5/13* (2006.01)
(52) U.S. Cl. ............................... 327/247; 327/250
(58) Field of Classification Search ............... None
See application file for complete search history.

(56) References Cited

U.S. PATENT DOCUMENTS

| | | | |
|---|---|---|---|
| 6,194,947 B1* | 2/2001 | Lee et al. | 327/359 |
| 6,204,733 B1* | 3/2001 | Cai | 331/108 B |
| 6,359,486 B1* | 3/2002 | Chen | 327/231 |
| 6,888,389 B2* | 5/2005 | Baba | 327/261 |
| 7,016,452 B2* | 3/2006 | Partsch et al. | 375/376 |
| 7,084,689 B2* | 8/2006 | Carballo et al. | 327/295 |
| 2005/0227660 A1* | 10/2005 | Hashemi et al. | 455/276.1 |

OTHER PUBLICATIONS

Weinlander et al., "An 8 channel 36G Sample/s CMOS Timing Analyzer," IEEE ISSCC (2000).
Sidiropoulos et al., "A Semi-digital Dual Delay-Locked Loop," IEEE JSSC, vol. 32, No. 11 (1997).

* cited by examiner

*Primary Examiner*—Timothy P. Callahan
*Assistant Examiner*—An T. Luu

(57) ABSTRACT

Methods and apparatus are provided for maintaining a desired slope of clock edges in a phase interpolator using an adjustable bias. The disclosed phase interpolator comprises at least one delay element to generate at least two interpolation signals each having an associated phase and a variable slope unit associated with each of the at least two interpolation signals, wherein a slope of each of the variable slope units is controlled by a bias signal and is varied based on a data rate of the interpolation signals. The slope is varied to maintain a desired slope of clock edges associated with the interpolation signals. The slope can be maintained, for example, between approximately the value of the delay between consecutive clock edges and twice the value of the delay between consecutive clock edges.

20 Claims, 2 Drawing Sheets

US 7,205,811 B2

METHODS AND APPARATUS FOR MAINTAINING DESIRED SLOPE OF CLOCK EDGES IN A PHASE INTERPOLATOR USING AN ADJUSTABLE BIAS

FIELD OF THE INVENTION

The present invention is related to techniques for clock and data recovery (CDR) techniques and, more particularly, to techniques for improving the linearity of phase interpolators.

BACKGROUND OF THE INVENTION

In many applications, including digital communications, clock and data recovery (CDR) must be performed before data can be decoded. Generally, in a digital clock recovery system, a reference clock signal of a given frequency is generated together with a number of different clock signals having the same frequency but with different phases. In one typical implementation, the different clock signals are generated by applying the reference clock signal to a delay network. Thereafter, one or more of the clock signals are compared to the phase and frequency of an incoming data stream and one or more of the clock signals are selected for data recovery.

A number of existing digital CDR circuits use voltage controlled delay loops (VCDL) to generate a number of clocks having the same frequency and different phase for data sampling (i.e., oversampling). One technique for generating multiple clock signals having a phase spacing that is smaller than a delay element is to interpolate between the delay stage phases. Phase interpolators are typically controlled by an N bit interpolation control word that selects a desired one of $2^N$ possible phases. It has been found that many phase interpolators exhibit non-linearity as the data rate of the incoming clock signal is varied.

In particular, it is known that improved linearity is achieved when the clock edges entering the phase interpolator have an edge rate, or slope, that is in a range approximately between the value of the delay between each clock edge and twice the value of the delay between each clock edge. A slope in this range ensures that the interpolator output does not change so quickly that it reaches a steady-state intermediate level before the arrival of the second clock edge, resulting in interpolator non-linearity. There is currently no effective mechanism, however, to maintain a desired slope as the data rate is varied.

A need therefore exists for improved techniques for interpolating two input clock signals to generate a clock signal having a phase between the phase of the two input clock signals. A further need exists for improved interpolation techniques that provide a highly linear phase interpolation transfer function.

SUMMARY OF THE INVENTION

Generally, methods and apparatus are provided for maintaining a desired slope of clock edges in a phase interpolator using an adjustable bias. A phase interpolator according to the present invention comprises at least one delay element to generate at least two interpolation signals each having an associated phase and a variable slope unit associated with each of the at least two interpolation signals, wherein a slope of each of the variable slope units is controlled by a bias signal and is varied based on a data rate of the interpolation signals. According to one aspect of the invention, the slope is varied to maintain a desired slope of clock edges associated with the interpolation signals. For example, the slope can be maintained between approximately the value of the delay between consecutive clock edges and twice the value of the delay between consecutive clock edges.

A more complete understanding of the present invention, as well as further features and advantages of the present invention, will be obtained by reference to the following detailed description and drawings.

DETAILED DESCRIPTION

The present invention provides methods and apparatus for generating multiple clock phases, with a highly linear interpolation transfer function, for data sampling in clock and data recovery (CDR) systems. According to one aspect of the invention, a variable bias buffer stage provides linear interpolation over a wide range of operating frequencies and maintains desired input signal timing.

Figure 1:
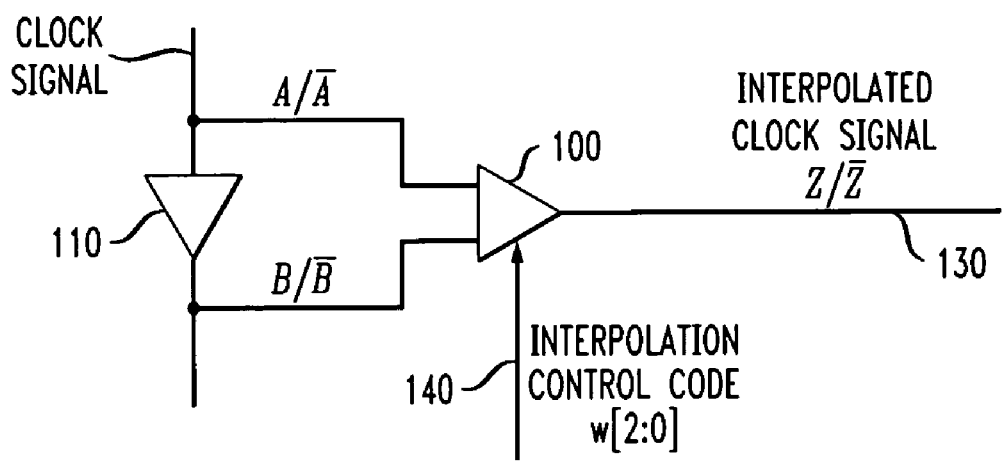
FIG. 1 is a schematic block diagram of a conventional phase interpolator.

FIG. 1 is a schematic block diagram of a conventional phase interpolator 100. As shown in FIG. 1, an input clock signal is applied to a delay stage 110 to generate two phase offset clock signals that are applied to the input of the analog phase interpolator 100. The input clock signal may be generated, for example, by a local voltage controlled oscillator (VCO) or a voltage controlled delay loop (VCDL). The analog phase interpolator 100 generates an interpolated clock signal 130 having a desired phase in response to an interpolation control code 140, in a known manner. For example, an interpolation control code 140 of 000 may correspond to a minimum phase value and an interpolation control code 140 of 111 may correspond to a maximum phase value.

Generally, the analog phase interpolator 100 generates an output clock having a phase that is the weighted sum of the two input phases. As shown in FIG. 1, the interpolator 100 receives two differential inputs, A/Ā and B/B̄, and generates an output phase, Z/Z̄, that is the weighted sum of the input phases. The weighting ratio is determined by the exemplary 3-bit phase control code 140.

Figure 2:
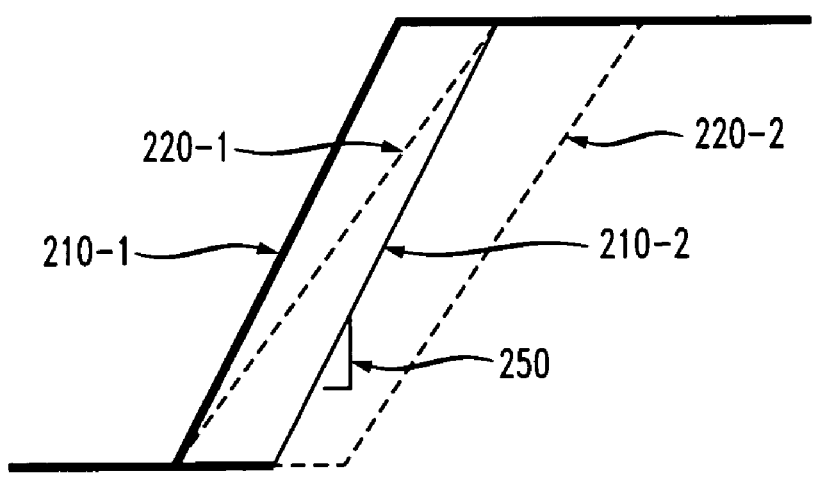
FIG. 2 illustrates a number of clock edges entering the phase interpolator of FIG. 1.

FIG. 2 illustrates a slope 250 of the clock edges entering the phase interpolator of FIG. 1 as a function of the delay between each clock edge. As shown in FIG. 2, the delay between two consecutive clock edges varies as a function of the data rate. For example, the delay between two subsequent clock edges 210-1 and 210-2 associated with a first clock rate is shorter than the delay between two subsequent clock edges 220-1 and 220-2 associated with a slower, second clock rate. As shown in FIG. 2, the edge rate, or slope, 250 of the clock edges 210, 220 is the change in magnitude of the clock signal divided by the change in time.

As previously indicated, it is known that the linearity of the phase interpolator 100 is improved when the clock edges 210, 220 entering the interpolator 100, have a slope that is approximately 1–2 times the value of the delay between them. A slope of approximately 1–2 times the value of the delay ensures that the output 130 of the interpolator 100 does not change so quickly that the output 130 reaches a steady-state intermediate level before the arrival of the second clock edge. The present invention recognizes that conventional phase interpolators 100 cannot maintain the desired slope of the clock edges 210, 220 as the data rate is varied.

Thus, according to one aspect of the invention, an adjustable bias is provided to apply a variable bias to input buffers as a function of the data rate, in order to maintain the desired slope. In this manner, the slope of the input and output waveforms is changed so that the desired relationship is always maintained.

Figure 3:
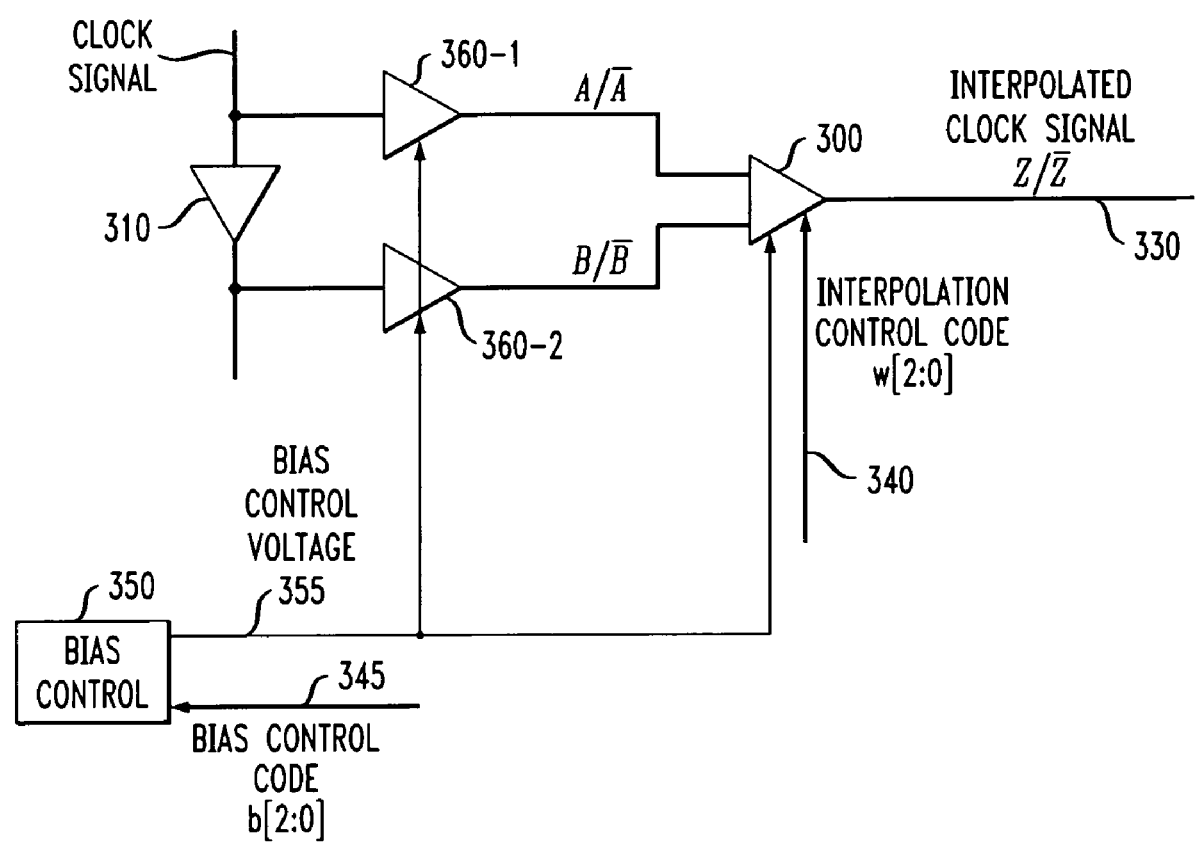
FIG. 3 is a schematic block diagram of a phase interpolator incorporating features of the present invention.

FIG. 3 is a schematic block diagram of a phase interpolator 300 incorporating features of the present invention. As shown in FIG. 3, an input clock signal is applied to a delay stage 310 to generate two phase offset clock signals that are applied to the input of the analog phase interpolator 300. The input clock signal may be generated, for example, by a local voltage controlled oscillator (VCO) or a voltage controlled delay loop (VCDL). The analog phase interpolator 300 generates an interpolated clock signal 330 having a desired phase in response to an interpolation control code 340, in a known manner. For example, an interpolation control code 340 of 000 may correspond to a minimum phase value and an interpolation control code 340 of 111 may correspond to a maximum phase value.

Generally, the analog phase interpolator 300 generates an output clock having a phase that is the weighted sum of the two input phases. As shown in FIG. 3, the interpolator 300 receives two differential inputs, A/$\overline{A}$ and B/$\overline{B}$, and generates an output phase, Z/$\overline{Z}$, that is the weighted sum of the input phases. The weighting ratio is determined by the exemplary 3-bit phase control code 240.

According to one aspect of the present invention, the two phase offset clock signals generated by the delay stage 310 are each applied to a corresponding buffer 360-1, 360-2. The slope of the buffered clock edges, A/Ab and B/Bb, applied to the interpolator 300, is adjusted based on the value of the applied bias voltage 355 generated by a bias control stage 350. The value of the bias voltage is determined by a bias control word 345 applied to the bias control stage 350. In this manner, the interpolator input clock edges, such as clock edges 210-1 and 210-2 in FIG. 2, can be controlled by the bias control word, b, to maintain a desired slope of the clock edges. In an exemplary embodiment, the bias control word 345 is a 3 bit value that provides 8 possible slope settings. For example, a bias control word 345 of 000 may apply a minimum bias control voltage 355, resulting in a minimum clock edge slope, and a bias control word 345 of 111 may apply a maximum bias control voltage 355, resulting in a maximum clock edge slope. As previously indicated, the bias control word 345 is varied with the data rate to maintain the desired slope 250.

Thus, the two differential inputs, A/$\overline{A}$ and B/$\overline{B}$, have a phase offset relative to one another, based on the delay provided by delay stage 310, but their edge rates, or slopes, are varied in a substantially uniform manner in accordance with the present invention by the corresponding buffer 360-1, 360-2.

As shown in the exemplary embodiment of FIG. 3, the same bias control voltage 355 controls both the buffers 360-1 and 360-2 and the phase interpolator 300. In this manner, the buffers 360-1 and 360-2 and the phase interpolator 300 track one another as the data rate changes. It is noted that in a further variation, the buffers 360-1 and 360-2 and the phase interpolator 300 can employ independent bias signals, as would be apparent to a person of ordinary skill in the art.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

We claim:

1. A phase interpolator, comprising:
   at least one delay element to provide at least two interpolation signals each having an associated phase;
   a variable slope unit associated with each of said at least two interpolation signals, wherein a slope of each of said variable slope units is controlled by a bias signal and wherein said slope is varied based on a data rate of said at least two interpolation signals; and
   an interpolator to process said at least two interpolation signals to generate an interpolated clock signal.

2. The phase interpolator of claim 1, wherein said slope is varied to maintain a desired slope of clock edges associated with said at least two interpolation signals.

3. The phase interpolator of claim 2, wherein said desired slope is approximately between the value of the delay between consecutive clock edges and twice the value of the delay between consecutive clock edges.

4. The phase interpolator of claim 1, wherein said phase interpolator generates a signal having a desired phase between a phase of two applied input signals.

5. The phase interpolator of claim 1, wherein said bias signal is generated by a bias control stage based on a bias control code, wherein said bias control code is an N bit value and said variable slope unit provides $2^N$ possible slope settings.

6. The phase interpolator of claim 1, wherein said bias signal is also applied to said interpolator.

7. The phase interpolator of claim 1, wherein said variable slope units comprise a buffer.

8. A method fox generating a signal having a desired phase between a phase of two applied input signals, comprising:
   delaying a clock signal to provide at least two interpolation signals each having an associated phase;
   varying the slope of each of said at least two interpolation signals based on a bias signal that is varied based on a data rate of said at least two interpolation signals; and
   processing said at least two interpolation signals to generate an interpolated clock signal.

9. The method of claim 8, wherein said slope is varied to maintain a is desired slope of clock edges associated with said at least two interpolation signals.

10. The method of claim 9, wherein said desired slope is approximately between the value of the delay between consecutive clock edges and twice the value of the delay between consecutive clock edges.

11. The method of claim 8, wherein said phase interpolator generates a signal having a desired phase between a phase of two applied input signals.

12. The method of claim 8, wherein a said bias signal is generated by a bias control stage based on a bias control code, wherein said bias control code is an N bit value and said varying step provides $2^N$ possible slope settings.

13. The method of claim 8, wherein said bias signal is also applied to said interpolator.

14. An integrated circuit, comprising:
a phase interpolator, comprising:
at least one delay element to provide at least two interpolation signals each having an associated phase;
a variable slope unit associated with each of said at least two interpolation signals, wherein a slope of each of said variable slope units is controlled by a bias signal and wherein said slope is varied based on a data rate of said at least two interpolation signals; and
an interpolator to process said at least two interpolation signals to generate an interpolated clock signal.

15. The integrated circuit of claim 14, wherein said slope is varied to maintain a desired slope of clock edges associated with said at least two interpolation signals.

16. The integrated circuit of claim 15, wherein said desired slope is approximately between the value of the delay between consecutive clock edges and twice the value of the delay between consecutive clock edges.

17. The integrated circuit of claim 14, wherein said phase interpolator generates a signal having a desired phase between a phase of two applied input signals.

18. The integrated circuit of claim 14, wherein said bias signal is generated by a bias control stage based on a bias control code wherein said bias control code is an N bit value and said variable slope unit provides $2^N$ possible slope settings.

19. The integrated circuit of claim 14, wherein said bias signal is also applied to said interpolator.

20. The integrated. circuit of claim 14, wherein said variable slope units comprise a buffer.

* * * * *

UNITED STATES PATENT AND TRADEMARK OFFICE
CERTIFICATE OF CORRECTION

PATENT NO. : 7,205,811 B2 Page 1 of 1
APPLICATION NO. : 11/095772
DATED : April 17, 2007
INVENTOR(S) : Freyman et al.

It is certified that error appears in the above-identified patent and that said Letters Patent is hereby corrected as shown below:

In claim 8, column 4, line 44, after "method" and before "generating" replace "fox" with --for--.

In claim 9, column 4, line 55, after "maintain a" and before "desired" delete "is".

In claim 12, column 4, line 64, after "wherein" and before "said" delete "a".

Signed and Sealed this

Twenty-first Day of October, 2008

JON W. DUDAS
*Director of the United States Patent and Trademark Office*